US011415264B2

(12) United States Patent
Bullock et al.

(10) Patent No.: US 11,415,264 B2
(45) Date of Patent: Aug. 16, 2022

(54) BRACKET ASSEMBLY AND METHOD FOR MOUNTING ELECTRICAL EQUIPMENT IN BETWEEN A MONITOR AND A SUPPORTING STRUCTURE

(71) Applicant: Karl Storz Endoscopy-America, Inc., El Segundo, CA (US)

(72) Inventors: Mitchell D. Bullock, El Segundo, CA (US); Thomas Whitehurst, El Segundo, CA (US)

(73) Assignee: Karl Storz Endoscopy-America, Inc., El Segundo, CA (US)

( * ) Notice: Subject to any disclaimer, the term of this patent is extended or adjusted under 35 U.S.C. 154(b) by 5 days.

(21) Appl. No.: 16/367,926

(22) Filed: Mar. 28, 2019

(65) Prior Publication Data

US 2020/0315042 A1 Oct. 1, 2020

(51) Int. Cl.
*F16M 11/04* (2006.01)
*F16M 13/02* (2006.01)
*H05K 5/02* (2006.01)

(52) U.S. Cl.
CPC ............ *F16M 13/02* (2013.01); *F16M 11/04* (2013.01); *H05K 5/0204* (2013.01)

(58) Field of Classification Search
CPC .. H05K 5/0204; A47G 1/1606; A47G 1/1613; A47G 1/162; A47G 1/1626; A47G 1/1633; A47G 1/164; F16M 11/04; F16M 11/041; F16M 13/02
See application file for complete search history.

(56) References Cited

U.S. PATENT DOCUMENTS

| | | | | |
|---|---|---|---|---|
| 3,636,669 A | * | 1/1972 | Attkisson | E04B 2/80 52/38 |
| 4,712,761 A | * | 12/1987 | Wassell | A47G 1/1606 248/475.1 |
| 6,400,560 B1 | * | 6/2002 | Chian | B60R 11/0235 248/917 |
| 6,935,883 B2 | * | 8/2005 | Oddsen, Jr. | H01R 13/625 248/274.1 |
| 6,953,895 B2 | * | 10/2005 | L'Henaff | H05K 5/0204 174/50 |
| D531,488 S | * | 11/2006 | Munson | D8/373 |
| D542,631 S | * | 5/2007 | Munson | D8/373 |
| D560,222 S | * | 1/2008 | Anderson | D14/451 |
| D560,676 S | * | 1/2008 | Wohlford | H01R 13/625 D14/451 |
| D561,188 S | * | 2/2008 | Wohlford | F16M 11/041 D14/451 |
| D561,749 S | * | 2/2008 | Sculler | D14/239 |

(Continued)

*Primary Examiner* — Jonathan Liu
*Assistant Examiner* — Guang H Guan
(74) *Attorney, Agent, or Firm* — Whitmyer IP Group LLC (57) ABSTRACT

A bracket assembly for mounting a display monitor to a support structure has a back plate configured to mount to the support structure; a back plate extension disposed along one side of the back plate; a front plate configured to mount to the display monitor; a front plate extension disposed along one side of the front plate; a contact surface formed by the front plate extension overlapping the back plate extension, the contact surface transferring a weight of the monitor to the support structure; and a volume at least partially enclosed by the front and back plates and extensions for housing an electronic component between the display monitor and the support structure.

20 Claims, 4 Drawing Sheets

(56) References Cited

U.S. PATENT DOCUMENTS

| | | | | |
|---|---|---|---|---|
| D574,815 S * | 8/2008 | Sculler | | D14/239 |
| D587,714 S * | 3/2009 | Sculler | | D14/239 |
| 7,719,832 B2 * | 5/2010 | Kobara | | G06F 1/1601 |
| | | | | 361/679.02 |
| 7,726,617 B2 * | 6/2010 | Zambelli | | F16M 11/041 |
| | | | | 248/222.12 |
| 7,857,270 B2 * | 12/2010 | Short | | F16M 11/10 |
| | | | | 248/284.1 |
| 7,918,426 B2 * | 4/2011 | Short | | F16M 11/105 |
| | | | | 248/225.11 |
| 8,191,837 B2 * | 6/2012 | Chen | | G06F 1/1607 |
| | | | | 248/176.1 |
| 8,389,875 B2 * | 3/2013 | Sakakieda | | H05K 5/0204 |
| | | | | 174/535 |
| 8,456,862 B2 * | 6/2013 | Lee | | F16M 11/10 |
| | | | | 361/679.01 |
| 8,523,132 B2 * | 9/2013 | Chen | | G06F 1/1607 |
| | | | | 248/176.1 |
| 8,837,132 B2 * | 9/2014 | Lin | | H05K 5/0204 |
| | | | | 361/679.21 |
| 8,905,366 B2 * | 12/2014 | Chen | | G06F 1/1607 |
| | | | | 248/176.1 |
| 8,991,062 B2 * | 3/2015 | Atkinson | | G01B 11/26 |
| | | | | 33/263 |
| 9,027,893 B2 * | 5/2015 | Cheng | | F16M 13/022 |
| | | | | 248/201 |
| 9,057,478 B2 * | 6/2015 | Chen | | F16M 13/02 |
| 9,179,775 B2 * | 11/2015 | Chen | | F16M 13/02 |
| 9,408,465 B2 | 8/2016 | Dowling et al. | | |
| 10,126,787 B1 * | 11/2018 | Aldridge | | G06F 1/1607 |
| 10,663,108 B2 * | 5/2020 | Yamamori | | F16M 11/041 |
| 10,774,982 B2 * | 9/2020 | Sung | | H05K 5/0204 |
| 10,876,325 B2 * | 12/2020 | Cheung | | G06F 1/1607 |
| 2005/0082453 A1 * | 4/2005 | Chuang | | F16M 13/02 |
| | | | | 248/300 |
| 2007/0170336 A1 * | 7/2007 | Li | | F16M 11/10 |
| | | | | 248/324 |
| 2008/0186669 A1 * | 8/2008 | Chang | | G06F 1/1607 |
| | | | | 361/679.02 |
| 2009/0052128 A1 * | 2/2009 | Yeh | | F16M 11/10 |
| | | | | 361/679.27 |
| 2010/0060116 A1 * | 3/2010 | Okano | | H05K 5/0204 |
| | | | | 312/223.1 |
| 2010/0148026 A1 * | 6/2010 | Jang | | G06F 1/1607 |
| | | | | 248/224.8 |
| 2010/0321876 A1 * | 12/2010 | Liu | | G06F 1/1601 |
| | | | | 361/679.22 |
| 2013/0048812 A1 * | 2/2013 | Lozano | | H05K 5/0204 |
| | | | | 248/220.22 |
| 2017/0211743 A1 * | 7/2017 | Yanyk | | H05K 5/0017 |
| 2019/0226635 A1 * | 7/2019 | Sung | | G06F 1/1601 |
| 2020/0315042 A1 * | 10/2020 | Bullock | | F16M 11/041 |

\* cited by examiner

BRACKET ASSEMBLY AND METHOD FOR MOUNTING ELECTRICAL EQUIPMENT IN BETWEEN A MONITOR AND A SUPPORTING STRUCTURE

TECHNICAL FIELD

The present invention relates to a mounting device for fixing a display monitor to a support structure, such as a boom arm, wall, or spine of a monitor stand. More specifically, the present invention relates to a mounting bracket assembly for attaching a rear surface of a display monitor to a support structure and for providing a housing in between the display monitor and the support structure to accommodate an electronic device, peripheral device, and/or accessory, within a healthcare environment (e.g., medical room, surgical observation room, operating theater, etc.).

BACKGROUND

In the field of televisions, monitors, and touchscreens, there are various mechanical devices that facilitate mounting and supporting these display apparatuses to a wall or other supporting structure. These conventional mounting devices usually consist of a panel or bracket that attaches directly to the rear or back surface of the monitor and to a wall or some other connecting component. Some mounting devices provide for the panel or bracket to tilt.

However, conventional mounting devices are difficult to install and require at least two people to attach the monitor to the supporting structure, especially in the case of a boom arm. Conventional mounting solutions also do not account for the need to accommodate other electronic or peripheral components in conjunction with the monitor. For example, known mounting devices do not provide space, e.g., an internal cavity or recess, for any electronic component or accessory, including but not limited to, a HD box(es), a video network reception box(es), a cable TV satellite box (es), wired or wireless internet reception device(s), decorders/encoders, etc. Instead, an additional wall mounted shelf, floor stand, or a separate mounting mechanism separate from the device supporting the TV is required to store and support a peripheral component or accessory. Additionally, the need for mounting additional electronics or peripheral devices in conjunction with the monitor limits the possible placement location of the monitor since additional wall and/or floor space must be considered. The wires and cables needed to connect the monitor to the peripheral electronic component can be long and take up significant floor space posing as a potential trip hazard, and thus be objectionable.

Further, there are strict hygiene standards and infection control policies imposed in healthcare environments, including medical rooms, surgical observation rooms, operating theaters, etc. Many conventional mounting devices are not designed for mounting TVs and other equipment in sterile healthcare environments. For example, known TV mounts have gaps and flat (horizontal) surfaces which are apt to collect dust or other contaminants. Conventional mounts do not adequately limit the transmission of infections, especially during installation and disassembly for servicing. Prior art mechanisms also leave cables and other cords more exposed. As a result, there is a higher chance that these parts may be contaminated and promote transmission of infections.

Attempts have been made to address the issues related to healthcare environments, but fail to do so and/or bring about other drawbacks. Some mounting mechanisms may be complicated to use with certain boom arms that may interfere with its mounting. One mounting solution involves creating new cable covers for each individual monitor brand offered that would provide mounting for equipment. However, it would be expensive to have a cable cover solution for each individual monitor. Some mounting mechanisms provide for an electronic component to be held below the bottom of the monitor, thereby exposing the component to possible blood splatter or damage from accidental tugging, pulling, or bumping when attempting to reposition the monitor during a medical operation or procedure. Other mounting mechanisms seek to resolve issues related to the healthcare environment by utilizing mounting interface patterns that do not adhere to VESA (Video Electronics Standards Association) interface standards. However, this solution prevents use of the mount across multiple boom arms and multiple monitor configurations.

U.S. Pat. No. 9,408,465 shows a mounting device for accommodating a peripheral device between a TV and a supporting wall. The mounting device consists of a rear panel having vertical interconnecting tabs and a front panel with vertical mating tabs. The tabs of the respective panels are secured together with conventional hardware, such as screws. However, the overlap of the vertical tabs does not transfer a weight of the TV to the wall. Instead, the screws must bear the entire weight of the TV (e.g., shear load), which can cause them to break or fracture, thereby rendering the mounting device inoperable. Moreover, the panels have retaining features which form a bottom side or base of the housing. Such configuration makes insertion and removal of the peripheral device into/out of the housing difficult as it requires the installer to reach over the top of the TV or to a height above it in order to gain access to the housing. In some situations, it may be necessary to detach the TV and front panel from the rear panel in order to be able to get access to the peripheral device. The top of the housing, on the other hand, is completely unobstructed. This allows for dust and other contaminant to settle and collect within the housing and on the electronic component. In a medical or healthcare environment, this is unsafe especially with respect to infection control when the peripheral device is removed for maintenance or replacement.

Thus, there exists a need in the art for a mounting device which has the capacity to fix a monitor to a supporting structure and mount a peripheral electronic device in between the monitor and the supporting structure while addressing the above problems.

SUMMARY

The needs set forth herein as well as further and other needs and advantages are addressed by the present embodiments, which illustrate solutions and advantages described below.

It is an object of the present teachings to remedy the above drawbacks and shortcomings associated with prior art mounting mechanisms and methods.

It is an object of the present teachings to provide a mounting system that enables a simple process for attaching a display monitor to a supporting structure which can be performed by a single person. The mounting system according to the present teachings enables the display monitor to be securely fixed to the supporting structure in a releasable manner, such that the monitor can be subsequently detached and re-attached.

It is another object of the present teachings to provide a mounting system which can house an electronic device in between a mountable monitor and a supporting structure.

It is also an object of the present teachings to provide a mounting system which can mount an electronic component in between a monitor and a supporting structure within a medical or operating room and minimize exposure of the electronic component to dust, contaminants, and other disease-causing agents. The present teachings provide for a way to mount a piece of equipment (electronic component, peripheral component, accessory) behind a monitor with little to no mounting surfaces being present.

It is an object of the present teachings to provide a mounting system which takes infection control into consideration and reduces the likelihood of transmitting communicable diseases during assembly/disassembly of the mounting system and insertion/withdrawal of the electronic component.

It is an object of the present teachings to provide a mounting system which enables quick and easy removal and installation of the electronic component from the monitor and the supporting structure without detaching the monitor from the supporting structure (and disconnecting any cables). This allows for efficient servicing of the electronic component.

It is an object of the present teachings to provide a mounting system which can support the weight of the monitor on the supporting structure (e.g., boom arm) with or without the electronic component present.

It is another object of the present teachings to provide a mounting system which houses an electronic component in between a monitor and a supporting structure and provides adequate ventilation for the electronic component to prevent overheating.

These and other objects of the present teachings are achieved by providing a bracket assembly and method for mounting an electronic device in between a display monitor and a support structure. The bracket assembly comprises a back plate configured to mount to the support structure, a back plate extension disposed along one side of the back plate, a front plate configured to mount to the display monitor, and a front plate extension disposed along one side of the front plate. The bracket assembly also comprises a contact area/surface formed by the front plate extension overlapping the back plate extension. The overlapping contact area/surface transfers a weight of the monitor to the support structure. Further, the bracket assembly comprises a volume that is at least partially enclosed by the front and back plates and extensions for housing an electronic component between the display monitor and the support structure. The front plate extension projects out in a rearward direction from the front plate, while the back plate extension projects out in a forward direction. The front and back plates are configured to be releasably attached to one another and enable a single person to easily mount the display monitor (e.g., TV, computer monitor, touchscreen, etc.) to the supporting structure (e.g., wall, ceiling, boom arm, etc.). In some embodiments, when the plates are attached, the front plate is parallel or substantially parallel to the back plate. In other embodiments, the front plate may be oriented transverse relative to the back plate, such that the volume for the electronic component housing narrows towards the top.

The contact area or surface is formed between an over surface of the back plate extension and an under surface of the front plate extension. In addition, or alternatively, the contact area or surface is formed between an edge surface of the back plate extension and the under surface of the front plate extension. The over surface and/or edge surface of the back plate extension may be angled slightly in an upward direction to more securely hold the display monitor. That is, the angle formed between the back plate and the over surface and/or the edge surface of the back plate extension may be characterized as obtuse. For example, the angle between the back plate and the over surface and/or the edge surface is between 90° and 150°. In other embodiments, the back plate and the over surface and/or the edge surface are perpendicular to one another. The front plate extension may be angled slightly in a downward direction to more securely hold the monitor. That is, the angle formed between the front plate and the under surface of the front plate extension may be characterized as acute. For example, the angle between the front plate and the under surface is between than 30° and 90°. In other embodiments, the front plate and the under surface are perpendicular to one another.

The front plate extension and the back plate extension are configured so that the under surface (of the front plate extension) and the over surface and/or edge surface (of the back plate extension) mate. Preferably, the under surface and the over surface and/or edge surface are parallel with one another.

Some embodiments of the bracket assembly comprise two back plate extensions disposed on the back plate, such that the contact area/surface is formed between an edge surface of each back plate extension and an under surface of the front plate extension. The two back plate extensions may be disposed on opposing sides of the back plate, and for example, opposing vertical sides of the back plate. The two back plate extensions help to more completely enclose the volume for the electronic component housing. Some embodiments of the bracket assembly comprise two more front plate extensions, and thus a total of three front plate extensions to more completely enclose the volume for the electronic component housing and to better position the front plate on the back plate.

The present teachings also provide a bracket assembly for mounting a display monitor to a support structure, which comprises a back plate having a plurality of mounting fixtures arranged according to VESA standard for receiving fasteners to mount the back plate to the support structure; a back plate extension disposed along one side of the back plate; a front plate configured to releasably attach to the back plate, the front plate having a plurality of mounting holes arranged according to VESA standard for receiving fasteners to mount the front plate to the support structure; and a front plate extension disposed along one side of the front plate. The bracket assembly also comprises a contact area/surface formed by the front plate extension overlapping the back plate extension, the contact surface transferring a weight of the monitor to the support structure; and a volume that is at least partially enclosed by said front and back plates and extensions for housing an electronic component between the display monitor and the support structure.

In some embodiments, the mounting fixtures protrude out from the back plate in a rearward direction and include holes for receiving the fasteners to secure the back plate to the support structure. The mounting fixtures are designed to mount the back plate to the supporting structure such that the weight of the display monitor—with or without the weight of an electronic component housed within the bracket—is transferred to the supporting structure. For example, the mounting fixtures may be designed to secure the back plate to a stationary or articulating boom arm.

The bracket assembly may have a second back plate extension, wherein the first back plate extension and the second back plate extension are disposed on opposing vertical sides of the back plate, such that the contact area/surface plate is formed between an edge surface of each back plate extension and an under surface of the front plate extension. The front plate may have two additional extensions on opposing vertical sides of the front plate to more completely enclose the volume for the electronic component housing and to position the front plate on the back plate. The two additional front plate extensions mate with the two back plate extensions.

In some embodiments, the bracket assembly includes at least one lock that secures the front plate against detaching from the back plate. For example, at least one of the back plate extensions has a first key hole, while at least one of the two additional front plate extensions has a second key hole, the first and second key holes align with each other when the plates are connected. The lock in the form of a fastener is insertable into the first and second key holes.

The bracket assembly may also comprise a cable fixture attached to the back plate, and more specifically, to the back plate extension. The cable fixture may include any type of data communication connector(s), such as, but not limited to, USB, coax, Ethernet, and XLR to provide electrical connection between the electronic component and the display monitor. In other embodiments, the cable fixture includes a networking device that provides wireless communication (e.g., WiFi, Bluetooth, radio, cellular, etc.) between the electronic component and the display monitor.

Other features and aspects of the present invention will become apparent from the following detailed description, taken in conjunction with the accompanying drawings, which illustrate by way of example the features in accordance with embodiments of the invention. The summary is not intended to limit the scope of the invention, which is defined solely by the claims attached thereto.

BRIEF DESCRIPTION OF THE DRAWINGS

It should be understood that through the drawings, corresponding reference numerals indicate like or corresponding parts and features.

DETAILED DESCRIPTION

The present teachings are described more fully hereinafter with reference to the accompanying drawings, in which the present embodiments are shown. The following description illustrates the present teachings by way of example, not by way of limitation of the principles of the present teachings.

The present teachings have been described in language more or less specific as to structural features. It is to be understood, however, that the present teachings are not limited to the specific features shown and described, since the devices herein disclosed comprise preferred forms of putting the present teachings into effect.

Figure 1:
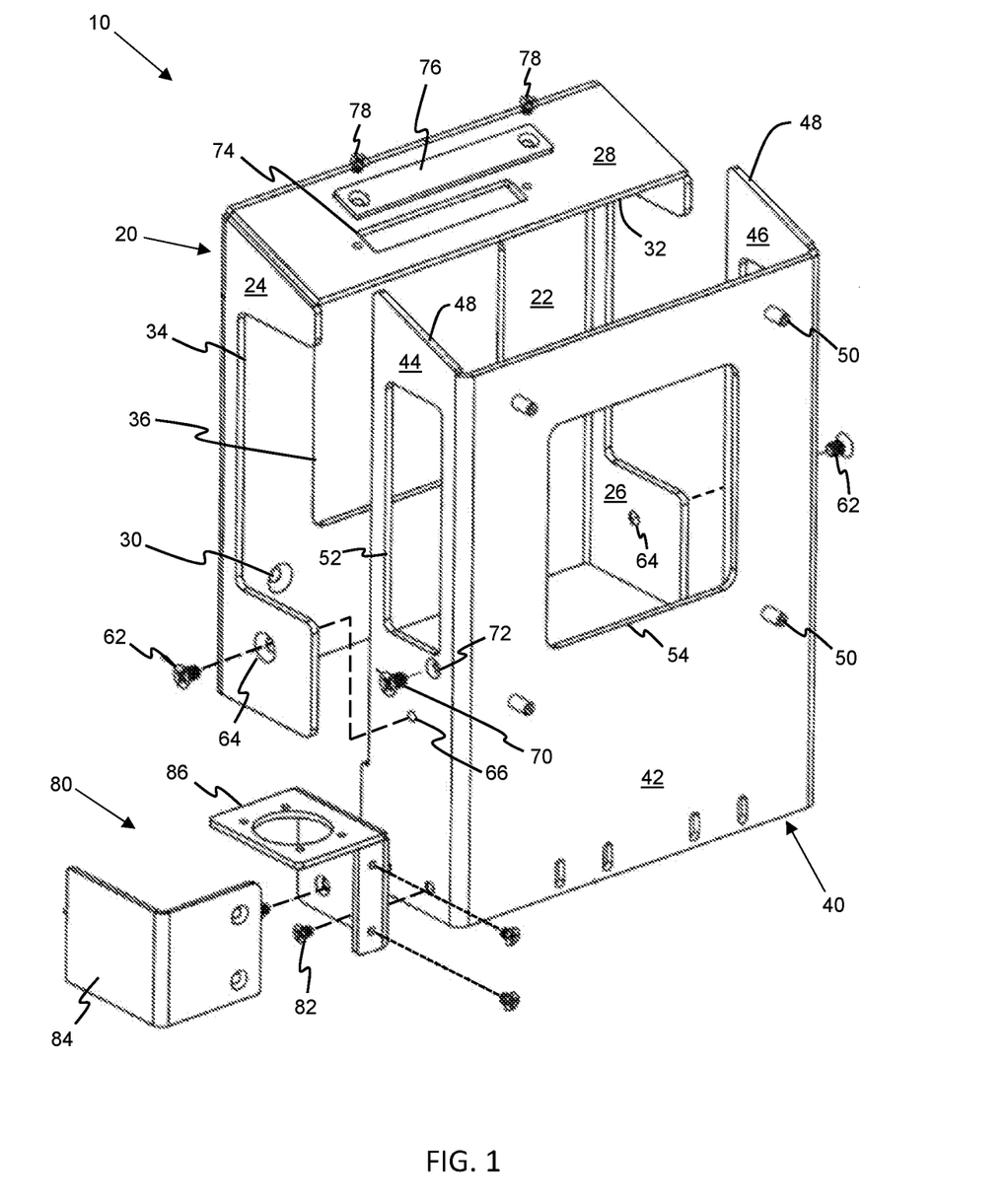
FIG. 1 is a perspective view of the mounting bracket assembly according to the present teachings in a disassembled state.
Figure 2:
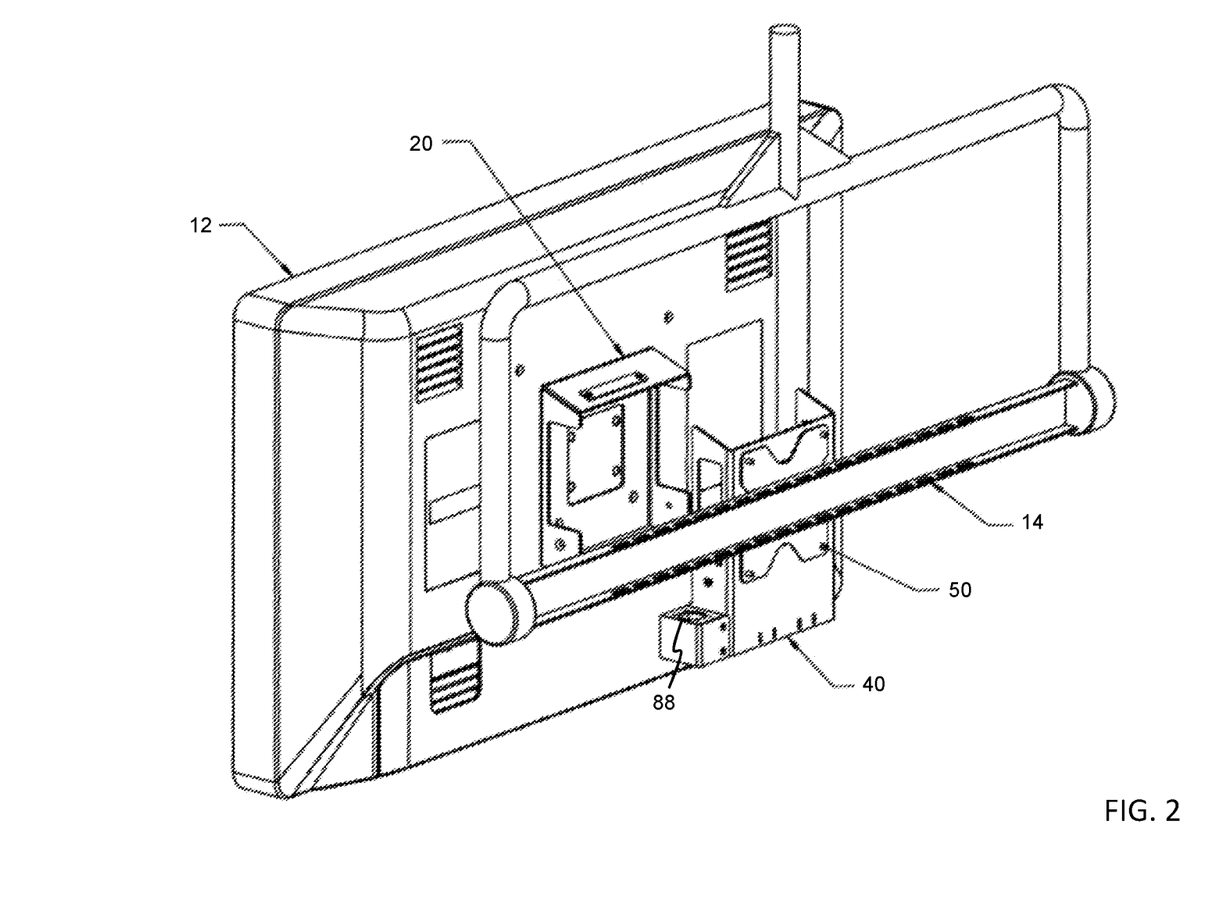
FIG. 2 is a perspective view of the mounting bracket assembly of FIG. 1, with one portion fixed to a supporting structure and another portion fixed to a display monitor.
Figure 3:
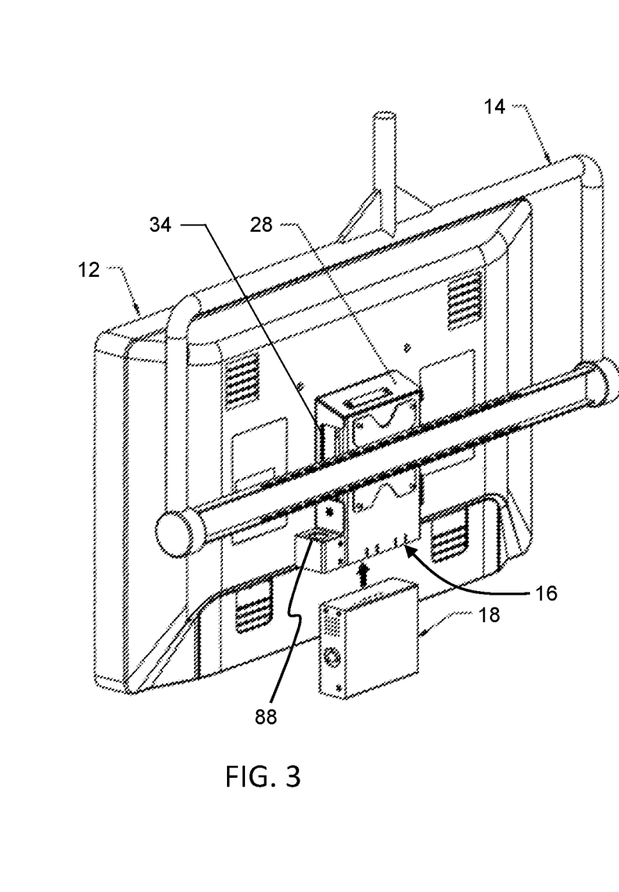
FIG. 3 is a perspective view of the mounting bracket assembly of FIG. 1 in an assembled state.
Figure 4:
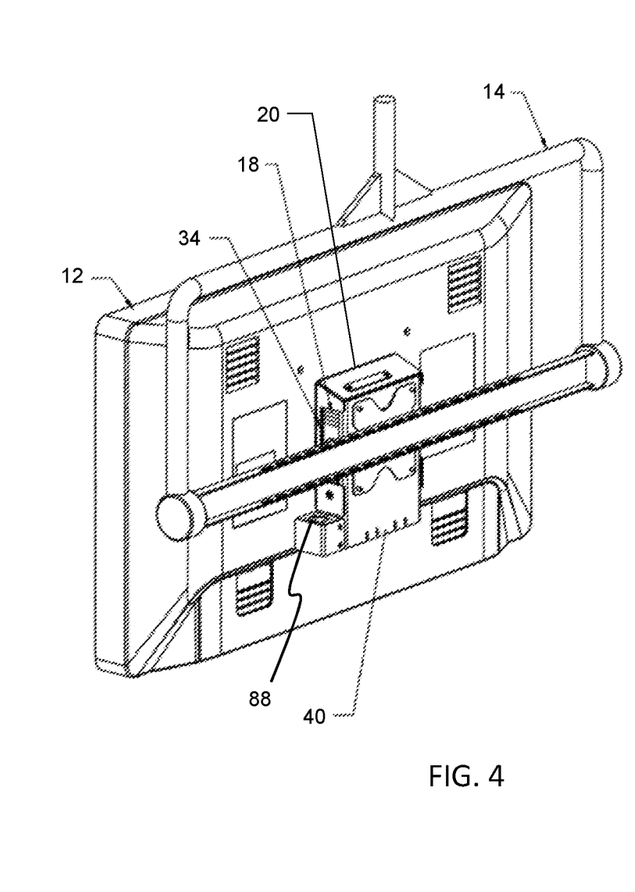
FIG. 4 is a perspective view of the mounting bracket assembly of FIG. 1 in an assembled state and with an electronic device housed therein.

Referring to FIG. 1, a mounting bracket assembly 10 according to the present teachings is shown in a disassembled or detached state. When assembled, the bracket assembly 10 is designed to securely fix a display monitor 12 to a supporting structure 14 (FIGS. 2-4). The bracket assembly 10 provides for the monitor 12 to be releasably attached to the supporting structure 14, so that the monitor 12 can be easily attached and detached from the supporting structure 14 by a single person. The bracket assembly does not require two or more people to install and mount the display monitor to the supporting structure. The display monitor 12 may comprise a television (TV) set, a computer monitor, a touchscreen, tablet, or the like. The supporting structure 14 may be a wall, a ceiling, or a mounting device that is directly or indirectly fixed to a wall, floor, or ceiling. In some embodiments, the bracket assembly is mountable to a mounting device in the form of a boom arm. The mounting device can be stationary or be moved or articulated into different positions/orientations. In other embodiments, the bracket assembly is adapted to mount to a spine of a TV stand or monitor stand.

Figure 5A:
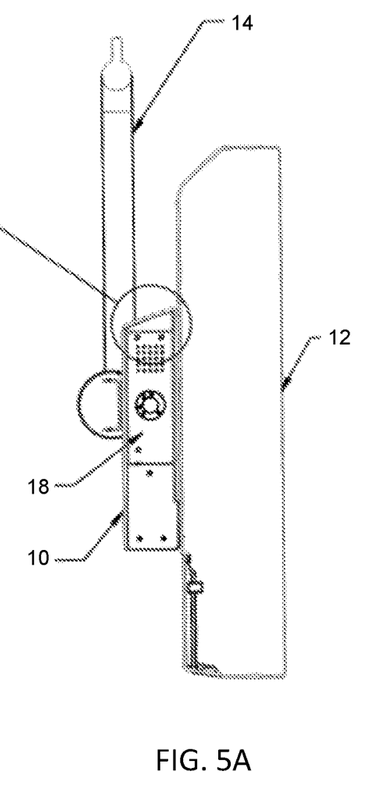
FIG. 5A is a side view of the mounting bracket assembly of FIG. 1, in an assembled state and with an electronic device housed therein.
Figure 5B:
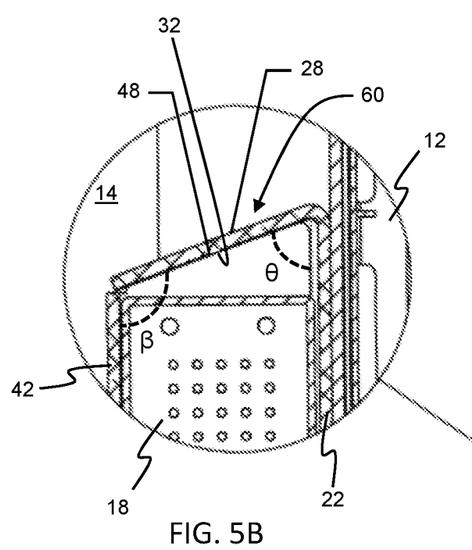
FIG. 5B is an enlarged view of an upper end of the mounting bracket assembly of FIG. 5A.

The bracket assembly 10 comprises two main components, a front panel 20 and a rear panel 40, which detachably connect to one another. The front panel and the rear panel securely mate with each other to form a housing 16 (FIG. 3) in between the panels. The housing 16 is adapted to receive and retain an electronic component 18, as shown in FIGS. 4, 5A, and 5B. Examples of an electronic component 18 include decoders and/or encoders, image processing units, camera control units, or other peripheral devices or accessories that are associated and used with the display monitor 12, especially within the context of a healthcare environment (e.g., medical room, surgical observation room, operating theater). In some embodiments, the electronic component is a 10G decoder. The housing 16 may be adapted to retain other electronic devices, such as but not limited to, a HD box(es), a video network reception box(es), a cable TV satellite box(es), and wired or wireless internet reception device(s). The bracket assembly 10 is configured to accommodate different size electronic components within the housing 16. In some embodiments, the housing formed between the front panel and the rear panel can simultaneously retain multiple electronic devices.

Both panels are rigid or substantially rigid in order to support the weight of the display monitor 12, with or without the electronic device 18 inserted within the housing 16. The front panel 20 and the rear panel 40 may be constructed from one or more metals, or from a composite material. The bracket assembly 10 in general may be formed by any one or more manufacturing processes, including but not limited to, casting, moulding, metal forming, machining, welding, and additive manufacturing.

The front panel 20 includes a front plate 22, and the rear panel 40 includes a back plate 42. As shown in the figures, the front and rear plates have the shape of a rectangle. Nevertheless, the plates may comprise other shapes. The front plate 22 is configured to mount to the display monitor 12, while the back plate 42 is configured to mount to the supporting structure 14, as shown in FIG. 2. A plurality of mounting holes 30 are formed through the front plate 22, each hole being adapted to receive a fastener such as a screw, bolt, or the like, to secure the front plate to the display monitor. The mounting holes 30 are arranged according to VESA mounting interface standard. This provides for universal mounting of the front panel 20 to all display monitors. In other embodiments, the mounting holes 30 may not be arranged according to VESA standard, but instead may utilize a unique mounting pattern that is specifically designed to match a mounting pattern on the display monitor.

The back plate includes a plurality of mounting fixtures 50, each being adapted to secure the back plate to the support structure 14. FIG. 1 depicts each mounting fixture 50 as a cylindrical protrusion which projects in a rearward direction from an exterior surface of the back plate 42. A hole is formed in the mounting fixture and extends from one end along the central axis of the fixture, wherein the hole receives a fastener such as a screw, bolt, or the like. Similar to the mounting holes 30, the mounting fixtures 50 are arranged according to VESA mounting interface standard. This provides for universal mounting of the rear panel 40 to all supporting structure. In other embodiments, the mounting fixtures 50 may not be arranged according to VESA standard, but instead may utilize a unique mounting pattern that is specifically designed to match a mounting pattern on the support structure.

In other embodiments, the front plate 22 may be integrated with the display monitor 12, and/or the back plate 42 may be integrated with the supporting structure 14. As such, the mounting holes 30, mounting fixtures 50, and corresponding fasteners may not be required.

The front panel 20 comprises at least one extension 28 disposed along one side of the front plate 22. The front plate extension 28 may be a support flange or the like, which projects in a rearward direction out from the front plate. The front plate extension 28 is disposed along an upper edge of the front plate 22, extending between opposing sides of the front plate. The upper edge of the front plate is illustrated in FIGS. 1-4 being substantially horizontal. In some embodiments, the extension 28 continues for the entire width of the front plate, wherein a first end of the extension is situated at one of the opposing sides and a second end of the extension is situated at the other opposing side. In other embodiments, the front plate extension 28 extends only a portion of the width of the front plate, while in other embodiments, the front plate extension 28 extends beyond the width of the front plate and as such protrudes beyond the borders of the front plate defined by the opposing sides.

The rear panel 40 comprises at least one extension 44, 46 disposed along at least one side of the back plate 42. The at least one back plate extension projects in a forward direction out from the back plate. The front plate extension 28 overlaps in a contact area/surface 60 with the back plate extension to transfer a weight of the monitor 12 to the support structure 14 and to at least partially enclose a volume defining the housing 16 for retaining the electronic component 18 between the display monitor and the support structure. In some embodiments, the rear panel 40 comprises two extensions 44, 46 disposed along opposing vertical sides of the back plate 42, as shown in FIG. 1. With two back plate extensions, the rear panel 40 more completely encloses the volume defining the electronic component housing 16. Both back plate extensions project in a forward direction out from the back plate, and preferably, are parallel to one another. The back plate extensions, conversely, may not be parallel with each other, but instead may be angled towards each other or away from each. When the front panel and the rear panel are releasably attached to one another, the front plate extension 28 overlaps in a contact area/surface 60 which is formed between an edge surface 48 of each back plate extension and the under surface 32 of the front plate extension, wherein the under surface lays on top of the edge surfaces. In some embodiments, the back plate extensions are in the form of flanges or the like.

To more securely hold the display monitor to the supporting structure and thus further maintain the weight of the display monitor on the supporting structure, the back plate extensions 44, 46 and/or the edge surfaces 48 may be angled slightly in an upward direction as the back plate extension projects in the forward direction. FIG. 1 shows in particular the edge surfaces 48 of the two back plate extensions 44, 46 defining a planar surface that is angled in an upward direction from an upper edge of the back plate 42. The angle β between the back plate and the edge surfaces 48 may be within a range from 90° to 150°, or from 90° to 135°, or from 90° to 120°. FIG. 5B, which is cross sectional view of a side of the bracket assembly, clearly shows the angle β. In addition or alternatively, the front plate extension 28 and/or the under surface 32 may be angled slightly in a downward direction to more securely hold the display monitor to the supporting structure and thus further maintain the weight of the display monitor on the supporting structure. The under surface 32 of the front plate extension 28 defines a planar surface that is angled in a downward direction from the upper edge of the front plate 22. The angle θ between the front plate and the under surface 32 is an acute angle. For example, the angle θ may be within a range from 30° to 90°, or from 45° to 90°, or from 60° to 90° (FIG. 5B). Preferably, the angles β and θ are supplementary angles or angles whose degree measures add up to or around 180°. With this configuration, the front plate extension and the back plate extensions mate with one another, wherein the under surface 32 and the edge surfaces 48 are parallel or substantially parallel.

In some embodiments, the back plate extensions 44, 46 and/or the edge surfaces 48 may be oriented perpendicular or substantially 90° to the back plate. That is, the angle β between the back plate and the edge surfaces 48 is substantially 90°. The front plate extension 28 and/or the under surface 32 may also be oriented perpendicular or substantially 90° to the front plate. In this configuration, the front plate extension and the back plate extensions mate with one another, wherein the under surface 32 and the edge surfaces 48 are parallel or substantially parallel.

Other configurations of the rear panel 40 may be used without detracting from the purpose of and the benefits imparted by the present teachings. In particular, the back plate 42 may have a back plate extension disposed along an upper edge of the back plate, wherein the upper edge is substantially horizontal. The back plate extension may extend only a portion of the width of the back plate, the entire width of the back plate, or beyond the width of the back plate such that the back plate extension protrudes beyond the opposing sides of the back plate. The contact area/surface 60 between the front panel and the rear panel is thereby formed between an over surface (upper surface) of the back plate extension and an under surface 32 (lower surface) of the front plate extension 28, wherein the under surface lays on top of the over surface. To more securely hold the display monitor to the supporting structure and thus further maintain the weight of the display monitor on the supporting structure, the back plate extension and/or the over surface may be angled slightly in an upward direction as the back plate extension projects in the forward direction. Alternatively, the back plate extension and/or the over surface is oriented perpendicular to the back plate. The angle between the back plate and the back plate extension and/or the over surface should preferably be supplementary to the angle θ formed between the front plate and the front plate extension 28 and/or under surface 32, i.e., the total of the degree measures added together should be substantially 180°. As such, the front plate extension and the back plate extensions mate with one another, wherein the under surface 32 and the over surface are parallel or substantially parallel. In addition to the back plate extension along the upper edge of the back plate, the rear panel 40 may also include one or more of the back plate extensions 44, 46 discussed above.

FIG. 1 shows that the front panel 20 may comprise two more front plate extensions 24, 26 projecting in a rearward direction from opposing vertical edges of the front plate 22. The front plate extensions 24, 26 help to more completely enclose the volume defining the electronic component housing 16 as well as to position the front plate on the back plate. The extensions 24, 26 can be in the form of side flanges or the like. The front plate extension 28 (support flange) is positioned between the side flanges 24, 26. In some embodiments, the ends of the front plate extension 28 are connected to the side flanges. Each side flange extends the entire length of the front plate 22. Alternatively, one or both of the side flanges may extend only a portion of the length of the front plate 22. The side flanges 24, 26 are oriented to be substantially perpendicular to the front plate and parallel to one another, as shown in FIG. 1. Conversely, the side flanges 24, 26 may not be parallel with each other, but instead may be angled towards each other or away from each other.

FIG. 3 illustrates when the bracket assembly is assembled. In this state, the front panel 20 is releasably attached to the rear panel 40 by positioning the front plate extension 28 over the back plate extension(s) 44, 46. More specifically, in a contact area/surface 60, the under surface 32 of the front plate extension 28 overlaps the edge surfaces 48 and/or over surface of the back plate extensions. The back plate extensions 44 and 46 also mate with the two more front plate extensions 24 and 26 when the bracket assembly is in the assembled state. For example, an inner surface of the front plate extension 24 overlaps an outer surface of the back plate extension 44, while an inner surface of the front plate extension 26 overlaps an outer surface of the back plate extension 46. If the front plate extensions 24, 26 are perpendicular to the front plate 22 and parallel to one another, the back plate extensions 44, 46 are similarly perpendicular to the back plate 42 and parallel to one another. However, if the front plate extensions 24, 26 are configured so that they angle towards each other as they project away from the front plate, the back plate extensions 44, 46 angle away from each other as they project from the back plate, or vice versa. This enables the front plate extensions to still mate with the back plate extensions. Further, this minimizes gaps or open spaces within the housing 16 that are not used or occupied by the electronic component when retained within the housing. Overall, the front panel and the rear panel are each dimensioned so that when the electronic component is inside the housing, there are minimal to no gaps or opens spaces in which dust or other contaminants may collect. As shown in FIG. 1, the length of the rear panel is greater than the length of the front panel. This means that the bottom end of the rear panel 40 extends further below than the bottom end of the front panel 20 when the bracket assembly is assembled. The extra length of the rear panel provides for a cable fixture 80 to be positioned on at least one of the back plate extensions 44, 46.

To further ensure that the front panel 20 does not inadvertently detach from the rear panel 40, the bracket assembly includes at least one locking mechanism 62. FIG. 1 specifically show an embodiment where the bracket assembly has two locking mechanisms 62. A screw, bolt, pin, or the like may serve as the locking mechanism 62. At least one key hole 64 is formed completely through one of or both of the front plate extensions 24, 26. One or more of the back plate extensions also has a key hole 66. The key hole 64 aligns with the key hole 66 when the front plate and back plate are releasably attached. With the key holes in alignment, the locking mechanism(s) 62 can be inserted therein. Accordingly, in order to detach the front panel from the rear panel, the locking mechanism 62 would have to be removed first. It is noted that the front panel can be secured to the rear panel without the locking mechanism(s) 62 and key holes 64, 66 present in the bracket assembly. That is, the absence of the locking mechanism(s) 62 and key holes 64, 66 does not detract from the purpose of and the benefits imparted by the present teachings.

Once the front and rear panels are connected to each other, the electronic component housing 16 is formed between the front plate 22, the front plate extensions 24, 26, 28, the back plate 42, and the back plate extensions 44, 46. Accordingly, the housing 16 is at least partially closed on six sides. The front and back plates are designed so that no extensions are present along their respective bottom edges. The housing is therefore open on a bottom side to provide for insertion and removal of the electronic device 18 into and out of the housing 16, as shown in FIGS. 3-4. The electronic component 18 can be easily inserted into the housing 16 with or without the display monitor being connected to the front panel 20.

In some embodiments, the bracket assembly comprises one or more fastening mechanisms 70 to secure the electronic component 18 within the housing 16. The fastening mechanism 70 may be a screw, bolt, pin, or the like. A through hole 72 is formed in one or both of the rear plate extensions 44, 46 and configured to receive the fastening mechanism(s) 70. When the fastening mechanism 70 is inserted into the through hole 72, it is then feed into a mounting hole in the electronic component 18. To remove the electronic component 18 from the housing 16, the fastening mechanism 70 would first have to be removed. In other embodiments, the electronic component 18 is pressure fitted within the housing 16 such that the fastening mechanism(s) 70 and through hole(s) 72 are not necessary to secure the electronic component 18 to the bracket assembly.

The front and rear panels 20, 40 are designed to allow ventilation for the electronic component 18. In particular, at least one of the back plate extensions 44, 46 has an aperture 52 therethrough. At least one of the front plate extensions 24, 26 has a cutout 34. As shown in FIG. 1, the cutout 34 is formed starting at a free end of the front plate extension and stretching in a direction towards the front plate 22. When the front panel 20 is releasably attached to the rear panel 40, the cutout 34 aligns with the aperture 52 to provide a ventilation opening into the housing 16, thereby providing air flow into and out of the housing. In preferred embodiments, both back plate extensions 44, 46 have an aperture 52, and both front plate extensions 24, 26 have a cutout 34. This increases the amount of air flow into and out of the housing, and as such, prevents overheating of the electronic component when it is retained within the housing.

A portion of the front plate 22 is removed in order to form an opening 36. This helps to reduce the weight of the front panel 20. The opening 36 can provide additional ventilation for the electronic component 18. Also, the opening 36 allows for a section of the display monitor 12 to be visible during installation. In some instances, the section of the display monitor made visible by the opening 36 may comprise inputs and outputs, which provide electrical connection (e.g., data, power) between the display monitor 12 and the electronic component 18. Likewise, a portion of the rear plate 42 is removed in order to form an opening 54, which helps to reduce the weight of the rear panel 40. The opening 54 can provide additional ventilation for the electronic component 18.

As shown in FIG. 1, the front plate extension 28 includes an orifice 74, which provides access to the interior of the electronic component housing 16 and to the electronic device 18 when it is retained within the housing. In some embodiments, the orifice 74 allows a user to manipulate the electronic component or engage buttons/controls on the electronic component while it is disposed within the housing. The bracket assembly 10 also comprises an access panel 76 which releasably attaches to the front plate extension 28 via a plurality of fasteners 78 in order to cover the orifice 74. The access panel 76 helps to cover the electronic component when access thereto is not necessary. This helps to reduce dust or other contaminants from entering and settling within the housing 16.

The bracket assembly also comprises a cable fixture 80 attached to one of the back plate extensions 44, 46 via a plurality of fasteners 82. The cable fixture 80 is formed by two L-shaped plates 84, 86 that are connected to one another. The cable fixture 80 also includes one or more communications connections or connectors 88 arranged between the L-shaped plates 84 and 86. Any type of data communication connector(s), such as, but not limited to, USB, coax, Ethernet, and XLR, provides electrical connection between the electronic device and the display monitor and/or between the electronic device and some other external system or device have cables feed through/along the supporting structure (e.g., boom arm).

The present teachings also provide for a method of mounting an electrical equipment 18 in between a display monitor 12 and a supporting structure 14 using the bracket assembly 10. Such method requires only one person to complete, but allows for multiple people to participate in the process. The method comprises: mounting the front panel 20 to the display monitor 12 by inserting fasteners through the mounting holes 30 and fixing them into the display monitor 12; and mounting the rear panel 40 to the support structure 14 by inserting another set of fasteners through mounting holes present in the support structure and then fixing them into the mounting fixtures 50 (FIG. 2). The method further comprises: lifting the display monitor with the front panel attached thereto to a height so that the front plate extension 28 is above or clears the rear panel; positioning the front panel to be aligned with the rear panel; and then placing the front panel over the rear panel so that the front plate extension overlaps in a contact area/surface 60 with the back plate extension (FIG. 3).

The step of positioning the front panel relative to the rear panel includes: aligning the front plate extensions 24, 26 in relation to the back plate extensions 44, 46. The front plate extensions should be arranged so that the back plate extensions can be inserted in between the front plate extensions in a mating manner. Also, after the step of placing the front panel over the rear panel, the method may optionally include locking the front panel to the rear panel. Once the contact area/surface 60 is achieved, the key hole(s) 64 in the front plate extensions 24, 26 become aligned with the key hole(s) 66 in the back plate extensions 44, 46. The locking mechanism 62 is then inserted through the key hole(s) 64 and fixed into the key hole(s) 66.

The method further comprises the steps of: inserting an electronic component 18 into the housing 16 from the bottom of the housing and securing the electronic component within the housing (FIGS. 3-4). The step of securing the electronic component may comprise using a fastening mechanism 70, wherein the fastening mechanism 70 is feed through a through hole 72 and fixed into a recess within the electronic component. In other embodiments, the step of securing may simply comprise establishing a pressure fitted contact between the electronic component and the rear and front panels of the bracket assembly.

The method also comprises the step of connecting the electronic component to the display monitor via the cable fixture 80. To remove the electronic component, the display monitor need not be detached from the support structure. Instead, the electronic component may simply be withdrawn through the bottom of the housing if there is no fastening mechanism 70, and if a fastening mechanism is present, then an initial step of removing the fastening mechanism 70 is required.

In some embodiments, the display monitor 12 can be detached from the support structure 14 without removing the electronic component 18 from within the housing 16 and without disassembling the bracket assembly 10. Specifically, the fasteners connecting the rear panel to the support structure at the mounting fixtures 50 can simply be removed. When this is done, the display monitor, bracket assembly, and electronic component (if present) are detached collectively.

It should be understood to a person of ordinary skill in the art that different configurations of the bracket assembly are possible. For example, the layout of the panels of the bracket assembly may differ from those shown in the Figures without departing from the scope and spirit of the present teachings. The particular components included in the bracket assembly and/or arrangement of components in the bracket assembly may differ from that shown in the Figures without departing from the scope and spirit of the present teachings.

While the present teachings have been described above in terms of specific embodiments, it is to be understood that they are not limited to those disclosed embodiments. Many modifications and other embodiments will come to mind to those skilled in the art to which this pertains, and which are intended to be and are covered by both this disclosure and the appended claims. For example, in some instances, one or more features disclosed in connection with one embodiment can be used alone or in combination with one or more features of one or more other embodiments. It is intended that the scope of the present teachings should be determined by proper interpretation and construction of the appended claims and their legal equivalents, as understood by those of skill in the art relying upon the disclosure in this specification and the attached drawings.

What is claimed is:

1. A bracket assembly for mounting a display monitor to a support structure, the bracket assembly comprising:
    a back plate configured to mount to the support structure;
    a first back plate extension disposed along one side of the back plate;
    a front plate configured to mount to the display monitor;
    a first front plate extension disposed along one side of the front plate;
    a contact area formed by the first front plate extension overlapping the first back plate extension, the contact area being configured to transfer a weight of the display monitor to the support structure; and a volume at least partially enclosed by the front plate, the back plate, the first front plate extension, and the first back plate extension for housing an electronic component between the display monitor and the support structure;

wherein, with the back plate oriented vertically, an edge surface of the first back plate extension is angled in an upward direction as the first back plate extension projects from the back plate, and the first front plate extension is angled in a downward direction as the first front plate extension projects from the front plate;

wherein the contact area is formed between the edge surface of the first back plate extension and an under surface of the first front plate extension; and wherein the edge surface of the first back plate extension is angled in the upward direction from an upper edge of the back plate to hold the display monitor.

2. The bracket assembly of claim 1, wherein the edge surface of the first back plate extension is an over surface.

3. The bracket assembly of claim 1, further comprising a second back plate extension, wherein the under surface of the first front plate extension is configured to contact the edge surface of the first back plate extension and an edge surface of the second back plate extension.

4. The bracket assembly of claim 3, wherein the second back plate extension is on an opposite side of the back plate relative to the one side along which the first back plate extension is disposed.

5. The bracket assembly of claim 3, wherein the first front plate extension is on an upper edge of the front plate.

6. The bracket assembly of claim 1, wherein the first front plate extension is angled in the downward direction from an upper edge of the front plate.

7. The bracket assembly of claim 1, comprising a second front plate extension and a third front plate extension disposed on the front plate for positioning the front plate on the back plate, wherein the volume is more enclosed by the second and third front plate extensions.

8. The bracket assembly of claim 7, wherein the first front plate extension is disposed between the second and third front plate extensions.

9. The bracket assembly of claim 7, further comprising a second back plate extension, the second back plate extension is disposed on an opposite side of the back plate relative to the one side along which the first back plate extension is disposed;

wherein the under surface of the first front plate extension is configured to contact the edge surface of the first back plate extension and an edge surface of the second back plate extension; and wherein the second and third front plate extensions are configured to overlap the first and second back plate extensions.

10. The bracket assembly of claim 9, further comprising:
a cutout formed in at least one of the second and third front plate extensions;
an aperture formed in at least one of the first and second back plate extensions;
wherein the aperture aligns with the cutout to provide a ventilation opening for providing air flow into and out of the volume when the front plate is connected to the back plate.

11. The bracket assembly of claim 10, wherein at least one of the first and second back plate extensions includes a fastener for securing the electronic component within the volume.

12. The bracket assembly of claim 1, further comprising a cable fixture attached to the first back plate extension.

13. The bracket assembly of claim 12, wherein the cable fixture includes an XLR connector for an electrical connection between the electronic component and the display monitor.

14. The bracket assembly of claim 1, wherein an angle formed between the back plate and the edge surface of the first back plate extension is obtuse.

15. A bracket assembly for mounting a display monitor to a support structure, the bracket assembly comprising:
a back plate having a plurality of mounting fixtures arranged according to VESA standard for receiving fasteners to mount the back plate to the support structure;
a first back plate extension disposed along one side of the back plate;
a second back plate extension, the second back plate extension being disposed on an opposite side of the back plate relative to one side along which the first back plate extension is disposed;
a front plate configured to releasably attach to the back plate, the front plate having a plurality of mounting holes arranged according to VESA standard for receiving fasteners to mount the front plate to the display monitor;
a first front plate extension disposed along one side of the front plate;
a contact area formed by the first front plate extension overlapping the first back plate extension, the contact area being configured to transfer a weight of the display monitor to the support structure; and
a volume at least partially enclosed by the front plate, the back plate, the first front plate extension, and the first back plate extension for housing an electronic component between the display monitor and the support structure;
wherein the volume is open on a bottom side thereof to provide for insertion and removal of the electronic component into and out of the volume;
wherein, with the back plate oriented vertically, an edge surface of the first back plate extension is angled in an upward direction as the first back plate extension projects from the back plate, and the first front plate extension is angled in a downward direction as the first front plate extension projects from the front plate; and
wherein an under surface of the first front plate extension is configured to contact the edge surface of the first back plate extension and an edge surface of the second back plate extension.

16. The bracket assembly of claim 15, wherein the mounting fixtures are configured to mount the back plate to a boom arm.

17. The bracket assembly of claim 15, comprising a second front plate extension and a third front plate extension on the front plate, wherein the second and third front plate extensions mate with the first and second back plate extensions.

18. The bracket assembly of claim 17, comprising at least one lock that secures the front plate against detaching from the back plate by reducing movement of the second and third front plate extensions away from the first and second back plate extensions.

19. The bracket assembly of claim 18, wherein:
at least one of the first and second back plate extensions has a first key hole;

at least one of the second and third front plate extensions has a second key hole, which aligns with the first key hole when the front and back plates are connected; and the at least one lock is a fastener that is insertable into the key holes.

20. The bracket assembly of claim 15, wherein an angle formed between the back plate and the edge surface of the first back plate extension is obtuse.

* * * * *